(12) United States Patent
Hanaoka

(10) Patent No.: US 7,057,282 B2
(45) Date of Patent: Jun. 6, 2006

(54) SEMICONDUCTOR DEVICE AND METHOD FOR MANUFACTURING THE SAME, CIRCUIT BOARD AND ELECTRONIC EQUIPMENT

(75) Inventor: Terunao Hanaoka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/802,668

(22) Filed: Mar. 17, 2004

(65) Prior Publication Data

US 2004/0245629 A1 Dec. 9, 2004

(30) Foreign Application Priority Data

Mar. 18, 2003 (JP) .............................. 2003-073925

(51) Int. Cl.
*H01L 23/48* (2006.01)
*H01L 23/52* (2006.01)

(52) U.S. Cl. ...................................... 257/737; 257/738

(58) Field of Classification Search ........ 257/737–738, 257/778–779, 747, 759, 781; 438/612–614
See application file for complete search history.

(56) References Cited

U.S. PATENT DOCUMENTS 6,396,145 B1 * 5/2002 Nagai et al. ................. 257/737

2002/0008320 A1 1/2002 Kuwabara et al.
2004/0166660 A1 * 8/2004 Yamaguchi ................. 438/613

FOREIGN PATENT DOCUMENTS

| JP | 08-124930 | 5/1996 |
|----|-----------|--------|
| JP | 11-204678 | 7/1999 |
| JP | 11-224885 | 8/1999 |
| JP | 2000-349189 | 12/2000 |
| JP | 2001-077231 | 3/2001 |
| JP | 2002-016178 | 1/2002 |
| JP | 2002-016197 | 1/2002 |
| WO | WO00/55898 | 9/2000 |

* cited by examiner

*Primary Examiner*—Phat X. Cao
*Assistant Examiner*—Theresa T. Doan
(74) *Attorney, Agent, or Firm*—Hogan & Hartson, LLP

(57) ABSTRACT

A semiconductor device includes a semiconductor substrate including an integrated circuit and an electrode. A resin layer is provided on a side of the semiconductor substrate where the electrode is formed and a wiring layer is formed on an area reaching from the electrode to a top of the resin layer. The electrode has a first rim part facing a periphery of the semiconductor substrate and a second rim part facing a center region of the semiconductor substrate. The resin layer is formed so as to overlap the second rim part, leaving out an area from the periphery of the semiconductor substrate to the first rim part of the electrode.

12 Claims, 2 Drawing Sheets

SEMICONDUCTOR DEVICE AND METHOD FOR MANUFACTURING THE SAME, CIRCUIT BOARD AND ELECTRONIC EQUIPMENT

BACKGROUND OF THE INVENTION

1. Field of the Invention

The present invention relates to a semiconductor device, a method for manufacturing the same, a circuit board and electronic equipment.

2. Description of the Related Art

Chip scale/size packages (CSP)s have been widely used as semiconductor device packages. Further, the technology for manufacturing packages at the wafer level (wafer level packages) is currently under development. With packages manufactured by this method (for example wafer level CSPs), the outer dimensions determine the dimensions of the semiconductor chip, and it is therefore important to increase the mountability by increasing wiring flexibility.

The present invention is intended to provide a semiconductor device with high mountability and high reliability, and a method for manufacturing the same, a circuit board and electronic equipment.

SUMMARY OF THE INVENTION

A semiconductor device according to one aspect of the present invention includes a semiconductor substrate having an integrated circuit and an electrode, a resin layer provided on a side of the semiconductor substrate where the electrode is formed and a wiring layer formed on an area reaching from the electrode to the top of the resin layer. The electrode has a first rim part facing the periphery of the semiconductor substrate, and a second rim part facing the center region of the semiconductor substrate. The resin layer is formed so as to overlap the second rim part, leaving out the area from the periphery of the semiconductor substrate to the first rim part of the electrode. According to the present invention, the resin layer is designed to overlap part of the electrode. Therefore, it becomes possible to form the resin layer in close proximity to the electrically conductive part of the electrode, and thus a large surface is available for the resin layer. Further, the resin layer is not formed in the periphery region out of the electrode. Therefore, even if the resin layer is formed in the proximity of the electrically conductive part of the electrode, it can be prevented that the resin layer is placed on the electrically conductive part of the electrode because of the contraction of the resin. Therefore, a semiconductor device with high mountability and highly reliable electrical connectivity can be provided.

According to an embodiment of the present invention, a passivation film having an opening which exposes part of the electrode can be formed on the side of the semiconductor substrate where the electrode is formed. The resin layer can be formed on the passivation film. Also, the resin layer can be formed leaving out a part exposed by the opening of the electrode. In this way, the resin layer is not placed on the electrically conductive part of the electrode. Therefore, a semiconductor device with highly reliable electrical connectivity can be provided.

According to an embodiment of the present invention, the center of the opening can be positioned so as to deviate from the center of the electrode towards the periphery of the semiconductor substrate. Accordingly, as a larger surface is available for the resin layer, a semiconductor device with high wiring flexibility can be provided. On a circuit board according to another aspect of the present invention, the above-mentioned semiconductor device is mounted. Electronic equipment according to another aspect of the present invention includes the above-mentioned semiconductor device.

A method for manufacturing a semiconductor device according to another aspect of the present invention includes forming a resin layer on a side of the semiconductor substrate having an electrode and an integrated circuit where the electrode is formed, and forming a wiring on an area reaching from the electrode to a top of the resin layer. The electrode has a first rim part facing a periphery of the semiconductor substrate, and a second rim part facing a center region of the semiconductor substrate. The resin layer is formed so as to overlap the second rim part, leaving out an area from the periphery of the semiconductor substrate to the first rim part of the electrode. According to the present invention, the resin layer is formed so as to overlap a part of the electrode. Therefore, it becomes possible to form the resin layer in close proximity to the electrically conductive part of the electrode, and thus a large surface is available for the resin layer. Further, the resin layer is not formed in the periphery region out of the electrode. Therefore, even if the resin layer is formed in the proximity of the electrically conductive part of the electrode, it can be prevented that the resin layer is placed on the electrically conductive part of the electrode because of the contraction of the resin. Therefore, a semiconductor device with high mountability and highly reliable electrical connectivity can be provided.

In this method for manufacturing a semiconductor device, a passivation film having an opening which exposes part of the electrode can be formed on the side of the semiconductor substrate where the electrode is formed. The resin layer can be formed on the passivation film.

In addition, the resin layer can be formed leaving out a part exposed by the opening of the electrode. Thereby, the resin layer is not placed on the electrically conductive part of the electrode. Therefore, a semiconductor device with highly reliable electrical connectivity can be provided.

Furthermore, the center of the opening can be positioned so as to deviate from the center of the electrode towards the periphery of the semiconductor substrate. Accordingly, as a larger surface is available for the resin layer, a semiconductor device with high wiring flexibility can be provided.

DESCRIPTION OF THE PREFERRED EMBODIMENT

Figure 1:
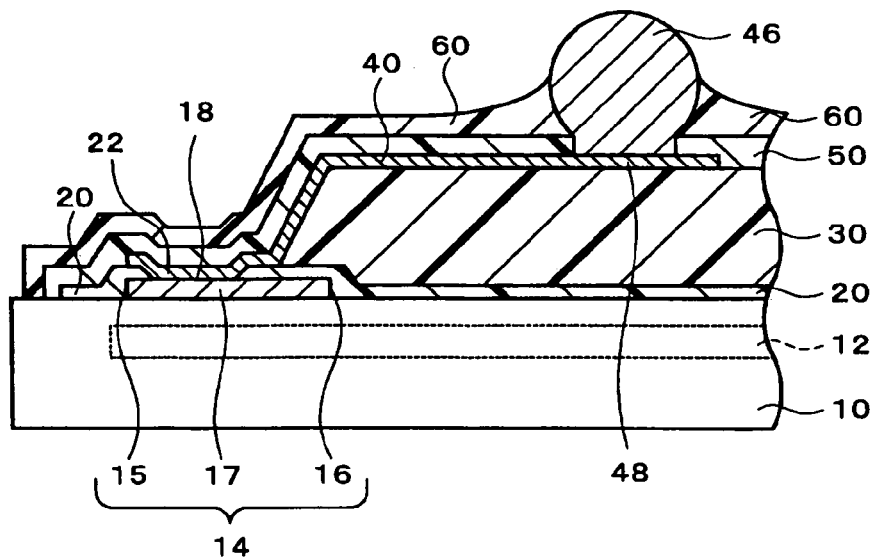
FIG. 1 is a view showing a semiconductor device according to an embodiment of the present invention.
Figure 2:
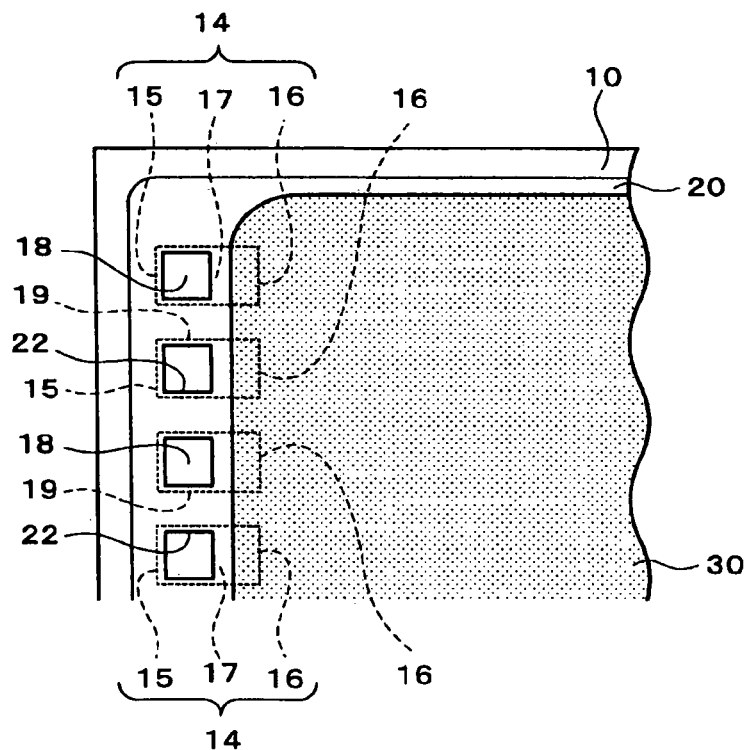
FIG. 2 is a view showing a semiconductor device according to an embodiment of the present invention.

Following is an explanation of embodiments of the present invention with reference to the drawings. However, the present invention is not limited to the below mentioned embodiments. FIG. 1 is a sectional view of a semiconductor device according to an embodiment of the present invention. FIG. 2 is a top view of the semiconductor device of the present embodiment without a wiring 40, a resist layer 50, a coat layer 60 and an external terminal 46.

The semiconductor device includes a semiconductor substrate 10. The semiconductor substrate 10 can be a semiconductor chip or a semiconductor wafer. On the semiconductor substrate 10, at least one integrated circuit 12 is formed. On a semiconductor chip one integrated circuit 12 is formed, whereas on a semiconductor wafer more than one integrated circuit 12 is formed. The semiconductor substrate 10 has a plurality of electrodes (for example pads), each of which are hereinafter referred to as an electrode 14. The electrode 14 can be made of Al. The electrode 14 can be electrically connected to the integrated circuit 12. Alternatively, an electrode that is not electrically connected to the integrated circuit 12 can be used as the electrode 14. The electrode 14 has a first rim part 15 facing the periphery of the semiconductor substrate 10, and a second rim part 16 facing the center region of the semiconductor substrate 10. Furthermore, the electrode 14 includes an intermediate part 17 flanked by the first rim part 15 and the second rim part 16.

A passivation film 20 can be formed on the side of the semiconductor substrate 10 where the electrode 14 is formed. In this case, the passivation film 20 has an opening 22 which exposes part of the electrode 14. The passivation film 20 can be formed so that the opening 22 is located at the intermediate part 17 of the electrode 14. Further, the passivation film 20 can be positioned so as to make the center of the opening 22 deviate from the center of the electrode 14 towards the periphery of the semiconductor substrate 10. The passivation film 20 can be made of SiN, $SiO_2$, polyimide resin, and the like.

The semiconductor device includes a resin layer 30. The resin layer 30 is designed on the side of the semiconductor substrate 10 where the electrode 14 is formed. The resin layer 30 is formed so as to overlap the second rim part 16 of the electrode 14, leaving out the area from the periphery of the semiconductor substrate 10 to the first rim part 15 of the electrode 14. The resin layer 30 can be formed leaving out the middle part of the intermediate part 17 of the electrode 14. The resin layer 30 can be formed so as to overlap a rim part 19 of the intermediate part 17 of the electrode 14. Alternatively, the resin layer 30 can be formed so as to not overlap the rim part 19. In the case where the semiconductor substrate 10 has the passivation film 20, the resin layer 30 is formed on the passivation film 20. The resin layer 30 overlaps the second rim part 16, with the passivation film 20 therebetween. In this case, the resin layer 30 can be formed leaving out an exposed part 18 exposed by the opening 22 of the passivation film 20 of the electrode 14. The resin layer 30 can have stress relaxation properties. The resin layer 30 can be made of a resin such as polyimide resin, silicone modified polyimide resin, epoxy resin, silicone modified epoxy resin, benzocyclobutene (BCB), and polybenzoxazole (PBO). The resin layer 30 can be formed between the semiconductor substrate 10 and an external terminal 46.

As explained above, the resin layer 30 of the semiconductor device according to the present embodiment is designed so as to overlap part of the electrode 14. Therefore, it becomes possible to form the resin layer 30 in close proximity to the electrically conductive part (for example the exposed part 18) of the electrode 14. Therefore, more area of the resin layer 30 is available, and thereby increasing wiring flexibility. Further, the resin layer 30 is not formed in a periphery region out of the electrode 14 (more specifically, the region reaching from the periphery of the semiconductor substrate 10 to the first rim part 15 of the electrode 14). Therefore, even in the case of contraction of the resin, it can be prevented that the resin layer 30 is placed on the electrically conductive part of the electrode 14, and the reliability of the electrical connectivity can be increased. In other words, according to the present invention, a semiconductor device can be provided featuring high mountability and highly reliable electrical connectivity. Furthermore, with the passivation film 20 being positioned so as to make the center of the opening 22 deviate from the center of the electrode 14 towards the periphery of the semiconductor substrate 10, a larger surface is available for the resin layer 30, and as a result a semiconductor device with an excellent mountability can be provided.

The semiconductor device includes at least one wiring layer 40. Each wiring layer 40 can be composed of one layer or a plurality of layers. The wiring layer 40 can also cover the entire part of the exposed part 18 exposed by the opening 22 of the electrode 14. The wiring layer 40 is formed so as to reach from the electrode 14 to the top side of the resin layer 30 (the side opposite of the side of the passivation film 20). As shown in FIG. 1, the wiring layer 40 can be formed so as to pass by a lateral side of the resin layer 30.

The semiconductor device can have a plurality of external terminals 46. The external terminals 46 are electrically connected to the wiring layer 40. The external terminals 46 can be formed on a land 48 of the wiring layer 40. The external terminals 46 are made of a conductive metal (for example an alloy) that is melted to be electrically connected (for example solder). The external terminals 46 may consist of either soft solder or hard solder. The external terminals 46 can be of spherical shape, for example, they can be solder balls.

The semiconductor device can include a resist layer 50. The resist layer 50 covers at least part of the wiring layer 40. By covering the entire part of the wiring layer 40 with the exception of the part designated for the external terminals 46 with the resist layer 50, the oxidation or corrosion of the wiring layer 40 can be prevented, and thus not resulting in electrical defects. The resist layer 50 can be formed sparing at least the center part of the land 48 of the wiring layer 40. The resist layer 50 can also cover the periphery part of the land 48.

The semiconductor device can include a coat layer 60. The coat layer 60 can be formed on the resist layer 50. The coat layer 60 can be formed so as to cover the base part (lower rim part) of the external terminals 46. The coat layer 60 can include one part formed on the resist layer 50 and another part rising from the one part and covering the base part of the external terminals 46 (see FIG. 1). The coat layer 60 allows to reinforce at least the base part of the external terminals 46. Therefore, after the semiconductor device has been mounted on the circuit board, the coat layer 60 helps to disperse stress concentrations on the external terminals 46.

If the semiconductor substrate 10 is a semiconductor chip, the package size of the semiconductor device is almost equal to the size of the semiconductor chip and the semiconductor device can be classified as a CSP. It can also be called a flip chip with stress relaxation properties.

The semiconductor device according to the present embodiment is formed as explained above, and in the following, the corresponding manufacturing method will be explained. The method for manufacturing a semiconductor device according to the present embodiment includes forming the resin layer 30 on the semiconductor substrate 10 including the integrated circuit 12 and the electrode 14. The resin layer 30 is formed on the side of the semiconductor substrate 10 where the electrode 14 is formed. Further, the electrode 14 has a first rim part 15 facing the periphery of the semiconductor substrate 10, and a second rim part 16 facing the center region of the semiconductor substrate 10. Further, the electrode 14 can have an intermediate part 17 flanked by the first rim part 15 and the second rim part 16. On the semiconductor substrate 10, the passivation film 20 can be formed, and in that case, a resin layer can be formed on the passivation film 20. Further, for the passivation film 20, the previously explained content can be applied. The semiconductor substrate 10 can be a semiconductor or a semiconductor wafer. If the semiconductor substrate 10 is a semiconductor wafer, a plurality of semiconductor devices can be manufactured in one lot, and thus, semiconductor devices can be manufactured efficiently.

In the present embodiment, the resin layer 30 is formed so as to overlap the second rim part 16 of the electrode 14, leaving out the area from the periphery of the semiconductor substrate 10 to the first rim part 15 of the electrode 14. The resin layer 30 can be formed leaving out the middle part of the intermediate part 17 of the electrode 14. The resin layer 30 can be formed so as to overlap the rim part 19 of the intermediate part 17 of the electrode 14. Alternatively, the resin layer 30 can be formed so as to not overlap the rim part 19. If the semiconductor substrate 10 has the passivation film 20, the resin layer 30 can be formed leaving out the exposed part 18 of the electrode 14. For example, the resin layer 30 can be formed by providing resin exclusively in a predetermined region. Further, the resin layer 30 can be formed by forming a resin layer on the entire surface of the side of the semiconductor substrate 10 where the electrode is formed, and by later removing any unnecessary parts. In this case, part of the resin layer can be removed by photolithography technology, or etching, for example.

Afterwards, the wiring layer 40 is formed. The wiring layer 40 is formed so as to reach from the electrode 14 to the top of the resin layer 30. The wiring layer 40 can be formed by any previously publicly known method. For example, the wiring layer 40 can be formed by sputtering, or by applying the additive method forming the wiring layer 40 with nonelectrolytic plating. Alternatively, the wiring layer 40 can be formed by spreading a conductive paste by an inkjet method.

Figure 3:
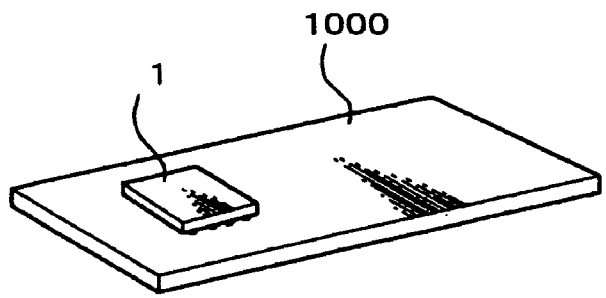
FIG. 3 is a view showing a circuit board on which a semiconductor device according to an embodiment of the present invention is mounted.
Figure 4:
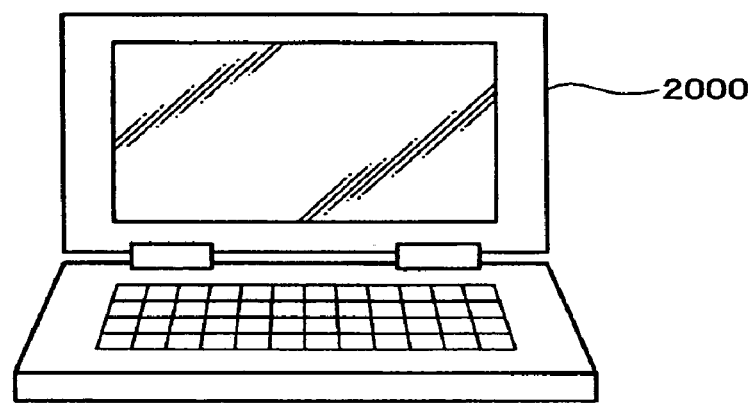
FIG. 4 is a view showing electronic equipment having a semiconductor device according to an embodiment of the present invention.
Figure 5:
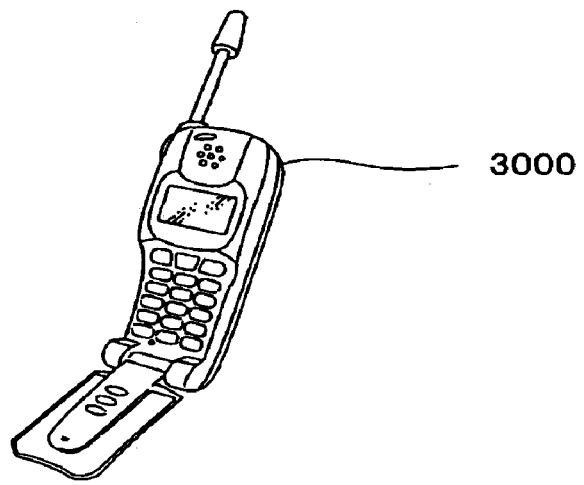
FIG. 5 is a view showing electronic equipment having a semiconductor device according to an embodiment of the present invention.

Finally, the external terminals 46, the resist layer 50, the coat layer 60 and the like are formed. If the semiconductor substrate 10 is a semiconductor wafer, the substrate is cut into individual semiconductor devices, thus completing the semiconductor device 1 according to the present embodiment. FIG. 3 shows a circuit board 1000 onto which the semiconductor device 1 according to the present embodiment is mounted. Further, as examples of electronic equipment including the semiconductor device 1, FIG. 4 shows a notebook type personal computer 2000 and FIG. 5 shows a mobile phone 3000.

Furthermore, the present invention is not limited to the embodiments detailed above, but rather allows for a variety of variations. For example, the present invention includes constructions that are substantially identical to the construction explained in the embodiment, (for example, identical construction regarding functions, methods and results, or advantages and effects). Further, the present invention includes constructions wherein the part that is not essentially of the construction explained in the embodiment has been changed. Further, the present invention includes constructions that have the same effect of usage, or achieve the same results as the construction explained in the embodiment. Further, the present invention includes constructions as explained in the embodiment to which publicly known technology has been added.

What is claimed is:

1. A semiconductor device, comprising:
   a semiconductor substrate including an integrated circuit and an electrode;
   a passivation film having an opening which exposes a part of the electrode formed on a side of the semiconductor substrate where the electrode is formed;
   a resin layer provided on the passivation film; and
   a wiring layer formed on an area reaching from the electrode to a top of the resin layer,
   wherein the electrode has a first rim part facing a periphery of the semiconductor substrate and a second rim part facing a center region of the semiconductor substrate, and
   wherein the resin layer is formed so as to overlap the second rim part, leaving out an area from the periphery of the semiconductor substrate to the first rim part of the electrode.

2. The semiconductor device according to claim 1, wherein the resin layer is formed leaving out the exposed part by the opening of the electrode.

3. The semiconductor device according to claim 1, wherein a center of the opening is positioned so as to deviate from a center of the electrode towards the periphery of the semiconductor substrate.

4. A circuit board, where the semiconductor device according to claim 1 is mounted.

5. An electronic equipment, having the semiconductor device according to claim 1.

6. The semiconductor device according to claim 1, further comprising a plurality of external terminals electrically connected to the wiring layer.

7. The semiconductor device according to claim 1, further comprising a resist layer covering a part of the wiring layer.

8. The semiconductor device according to claim 7, further comprising a coat layer formed on the resist layer.

9. A semiconductor device, comprising:
   means for accommodating an integrated circuit and an electrode;
   a passivation film having an opening which exposes a part of the electrode formed on a side of the means for accommodating where the electrode is formed;
   a resin layer provided on the passivation film; and
   a wiring layer formed on an area reaching from the electrode to a top of the resin layer,
   wherein the electrode has a first rim part facing a periphery of the means for accommodating and a second rim part facing a center region of the means for accommodating, and
   wherein the resin layer is formed so as to overlap the second rim part, leaving out an area from the periphery of the means for accommodating to the first rim part of the electrode.

10. The semiconductor device according to claim 9, further comprising a plurality of external terminals electrically connected to the wiring layer.

11. The semiconductor device according to claim 9, further comprising a resist layer covering a part of the wiring layer.

12. The semiconductor device according to claim 11, further comprising a coat layer formed on the resist layer.

* * * * *